United States Patent
Salsman

(10) Patent No.: US 8,952,310 B2
(45) Date of Patent: Feb. 10, 2015

(54) PLASMONIC LIGHT SENSORS

(75) Inventor: Kenneth Edward Salsman, Pleasanton, CA (US)

(73) Assignee: Aptina Imaging Corporation, George Town (KY)

( * ) Notice: Subject to any disclaimer, the term of this patent is extended or adjusted under 35 U.S.C. 154(b) by 372 days.

(21) Appl. No.: 13/365,039

(22) Filed: Feb. 2, 2012

(65) Prior Publication Data

US 2012/0326009 A1    Dec. 27, 2012

Related U.S. Application Data

(60) Provisional application No. 61/439,833, filed on Feb. 4, 2011, provisional application No. 61/529,596, filed on Aug. 31, 2011.

(51) Int. Cl.
*H01L 27/00* (2006.01)
*H01L 27/146* (2006.01)
*H01L 31/0232* (2014.01)

(52) U.S. Cl.
CPC .... *H01L 27/14625* (2013.01); *H01L 27/14627* (2013.01); *H01L 27/14645* (2013.01); *H01L 27/14685* (2013.01); *H01L 31/02327* (2013.01)
USPC .................................................. 250/208.1

(58) Field of Classification Search
CPC ...... B82Y 20/00; G02B 6/1226; G02B 5/008; G01N 21/553
USPC ........................................... 250/208.1, 214.1
See application file for complete search history.

(56) References Cited

U.S. PATENT DOCUMENTS

2009/0065801 A1\* 3/2009 Conway et al. .............. 257/104
2010/0178018 A1\* 7/2010 Augusto ...................... 385/131
2012/0211644 A1    8/2012 Yang et al.

OTHER PUBLICATIONS

Sasagawa et al., "Dual-layer Metal-grid Polarized for Polarization Image Sensor in 65-nm CMOS Technology", 2012, 4 pages, IEEE.
Catrysse et al., "Integrated Color Pixels in 0.18-um Complementary Metal Oxide Semiconductor Technology", 2003, 14 pages (2293-2036), vol. 20, No. 12, J. Opt. Soc, Am. A, Optical Society of America.
Chen et al., "High Transmission and Low Color Cross-talk Plasmonic Color Filters Using Triangular-lattice Home Arrays in Aluminum Films", 2010, 13 pages, vol. 18, No. 13, Optics Express, Optical Society of America.

\* cited by examiner

*Primary Examiner* — Thanh Luu
(74) *Attorney, Agent, or Firm* — Treyz Law Group; Louis R. Levenson; Michael H. Lyons

(57) ABSTRACT

An electronic device may be provided a plasmonic light sensor. Plasmonic light sensors may include arrays of plasmonic image pixels that detect evanescent electron density waves, or plasmons, generated in the plasmonic image pixel through an interaction with incoming light. Plasmonic image pixels may include microlenses that focus the light onto conducting wires in the plasmonic image pixel. Plasmons generated on the surface of the conducting wire may propagate along the conducting wire. Detector circuitry may be coupled to the wire on which the plasmons propagate to detect the light through detection of the evanescent electron density wave. Detector circuitry may include a biasing component for biasing a photodiode such that a small amount of light results in an avalanche of charge, or a sudden increase in current, produced in the detector circuitry in response to the evanescent wave.

5 Claims, 3 Drawing Sheets

PLASMONIC LIGHT SENSORS

This application claims the benefit of provisional patent application No. 61/439,833, filed Feb. 4, 2011, and provisional patent application No. 61/529,596, filed Aug. 31, 2011 which are hereby incorporated by reference herein in its entirety.

BACKGROUND

This relates generally to electronic devices, and more particularly, to electronic devices having plasmonic light sensors.

Plasmonic effects are quantum surface field effects in which an evanescent wave of electron density oscillations, also called plasmons, is generated on or near a surface of a metal or meta-material in response to incident photons. In structures designed to exhibit plasmonic effects, incoming photons incident on the plasmonic structure generate plasmons associated with high intensity electromagnetic fields within nano-scale distances from the surface of the structure. These high intensity electromagnetic fields couple to the incoming photons and can slow the photons down and change their course of near the plasmonic surface. These plasmonic effects have been demonstrated in structured metal coatings on lenses and on metal wires and have been demonstrated to guide light along structures significantly smaller than a single wavelength of light.

Conventional electronic devices use image sensors formed in a silicon substrate to capture light using image pixels formed in the silicon substrate. Conventional image pixels include photodiodes, formed in the substrate, that capture the light and convert the light into electrical charge. In a typical configuration, image pixels include microlenses and color filter elements formed in the silicon substrate that focus and filter incoming light onto the photodiodes. Conventional image pixels are unable to efficiently detect light having wavelengths larger than the image pixel size.

It would therefore be desirable to be able to provide improved electronic devices with plasmonic light sensors.

DETAILED DESCRIPTION

Electronic devices such as digital cameras, computers, cellular telephones, or other electronic devices widely include image sensors for capturing image data. Image sensors in these devices may use one or more lenses to focus incoming light onto corresponding image sensors in order to capture a corresponding digital image. Image sensors may include arrays of image pixels. The image pixels in the image sensors may include photosensitive elements such as photodiodes that convert the incoming light into electric change. Electric charge produced by photodiodes may be converted into digital image data using transistors and processing circuitry within the device. Image sensors may have any number of pixels (e.g., hundreds or thousands or more).

Figure 1:
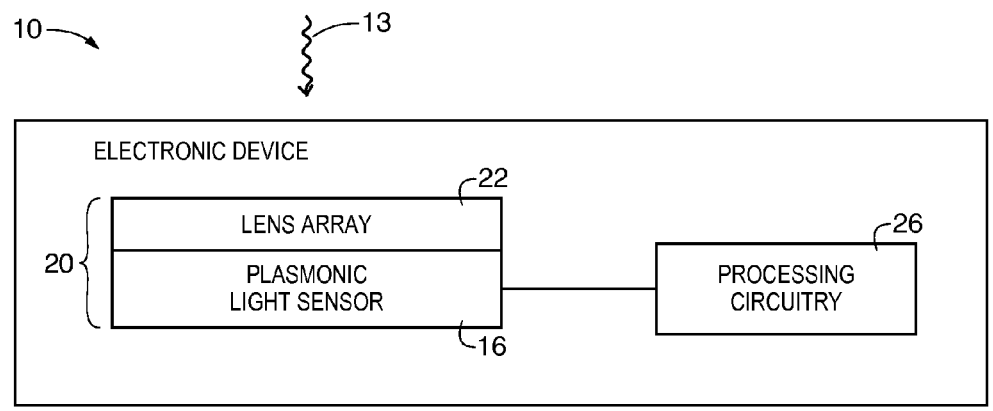
FIG. 1 is a diagram of an illustrative electronic device in accordance with an embodiment of the present invention.

FIG. 1 shows an electronic device in accordance with an embodiment of the present invention. Electronic device 10 of FIG. 1 may be a camera, cellular telephone, optofluidic microscope, computer, handheld device, portable computer, tablet computer, or other electronic equipment. As shown in FIG. 1, electronic device 10 may include an image sensor such as image sensor 20 for capturing an image, processing circuitry 26 for processing data and information captured, generated or received by image module 20, or other components. Image sensor 20 may be configured to receive incoming light 13 from an external object. Lenses in lens array 22 may be used to focus light 13 onto a plasmonic light sensor such as plasmonic light sensor 16. Plasmonic light sensor 16 may contain an array of plasmonic image pixels that collect, filter and convert the light into image data. The image data may be processed by processing control circuitry 26.

Circuitry 26 may be incorporated into image sensor 20 and/or may be implemented using external processing circuitry (e.g., a microprocessor, an application-specific integrated circuit, etc.). Processing circuitry 26 may include one or more integrated circuits (e.g., image processing circuits, microprocessors, storage devices such as random-access memory and non-volatile memory, etc.) and may be implemented using components that are separate from image sensor 20 and/or that form part of image sensor 20 (e.g., circuits that form part of an integrated circuit that includes plasmonic light sensor 16 or an integrated circuit within module 20 that is associated with plasmonic light sensor 16). Image data that has been captured by image sensor 12 may be processed and stored using processing circuitry 26. Processed image data may, if desired, be provided to external equipment (e.g., a computer or other device) using wired and/or wireless communications paths coupled to processing circuitry 26.

To provide plasmonic light sensor 16 with the ability to detect light of different colors, plasmonic light sensor 16 may be provided with a color filter array. Image pixels of plasmonic light sensor 16 may be associated with a pattern of color filter elements in which blue elements alternate with green elements in some rows and in which green elements alternate with red elements in other rows. This is merely illustrative. Plasmonic light sensor 16 may, if desired, be a grayscale image sensor or alternatively or in addition to a color filter array, plasmonic light sensor 16 may be a color-sensitive image sensor in which components of plasmonic image pixels may be individually configured to preferably accept a given color of light. Plasmonic image pixels in plasmonic light sensor 16 may be configured to detect extremely low intensity light (e.g., light in which less than 1000 photons of light are incident on plasmonic image pixels each second) by suitably biasing light sensor elements (e.g., as in a single photon avalanche diode (SPAD)). Plasmonic image pixels in plasmonic light sensor 16 that are biased to detect extremely low intensity light may be configured to be able to additionally detect arrival times of single photons adding arrival time data to image data that may be detected by plasmonic light sensor 16 and passed to processing circuitry 16.

Figure 2:
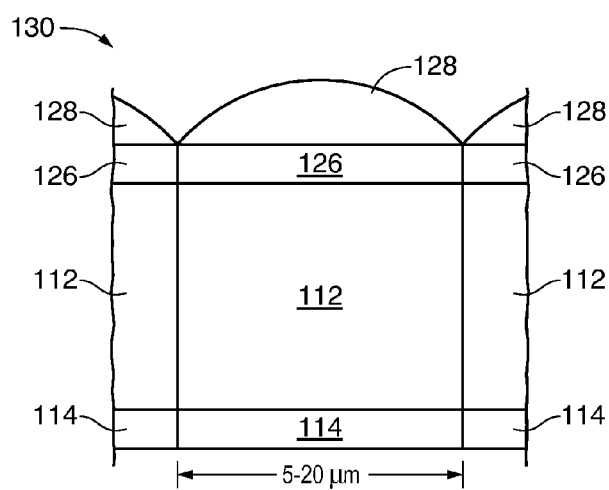
FIG. 2 is a cross-sectional side view of a conventional image pixel.

FIG. 2 is a cross-sectional side view of conventional image pixel 130. Conventional image pixel 130 includes photodiode 114 formed in silicon substrate 112. In a typical operation of conventional image pixel 130, light enters conventional image pixel 130 through a microlens such as microlens 128 on substrate 112. An array of color filters 26 is typically formed under an associated microlens 126 on substrate 112. Light that enters conventional image pixel 130 through microlens 128 may be filtered by color filter elements 126 before passing through substrate 112 and being absorbed by photodiode 114. Conventional image pixels such as conventional image pixel 130 have a lateral width (as indicated in FIG. 2) of between 5 and 20 microns. The lateral width of a conventional image pixel such as conventional image pixel 130 is typically a few times larger than the largest wavelength of light that conventional image pixel 130 is designed to detect. This creates a lower limit to the width of conventional image pixel 130. In order to pass through substrate 112 and be detected by photodiode 114, the path through substrate 112 must be larger than the wavelength of the light to be passed. Plasmonic structures, however, have been shown to be able to guide light through regions significantly smaller than the wavelength of light to be passed.

Figure 3:
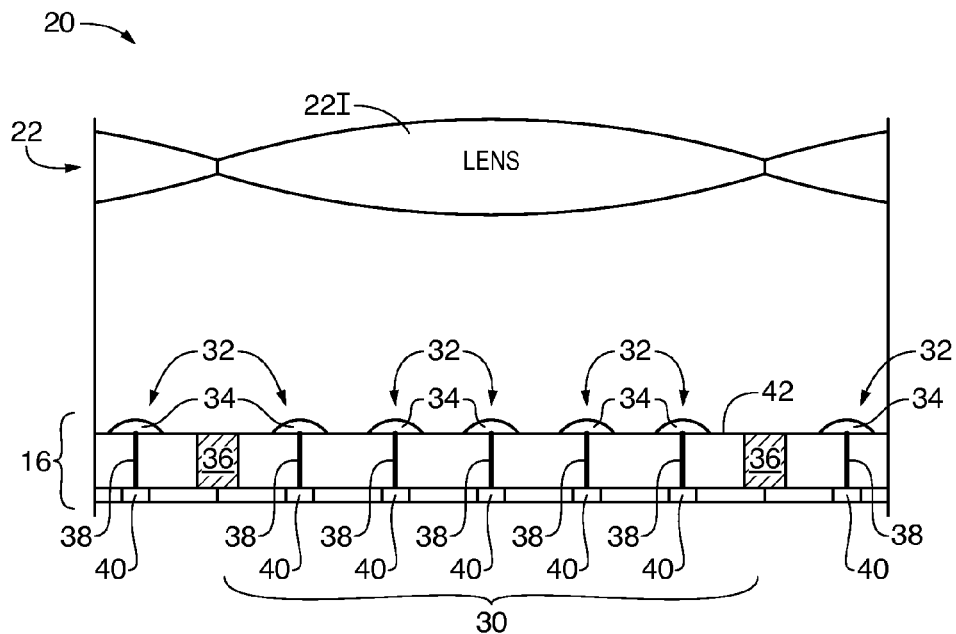
FIG. 3 is a cross-sectional side view of a portion of an illustrative imaging device having an array of plasmonic image pixels in accordance with an embodiment of the present invention.

FIG. 3 is a cross-sectional diagram of an image sensor such as image sensor 20 of FIG. 1 having a plasmonic light sensor such as plasmonic light sensor 16 that includes an array of plasmonic image pixels capable of detecting light having wavelengths larger than the plasmonic image pixels themselves. As shown in FIG. 3, lens array 22 may include one or more lenses 221 configured to focus light on plasmonic light sensor 16. Plasmonic light sensor 16 may include one or more pixel arrays such as pixel array 30 having one or more plasmonic image pixels such as plasmonic image pixels 32. Plasmonic light sensor 16 may be formed from a single array of plasmonic image pixels 32 or may be formed from multiple arrays of plasmonic image pixels separated by housing structures such as structure 36 and each having a corresponding lens 221 in lens array 22. As an example, electronic device 10 (see FIG. 1) may include a lens array having four lenses such as lens 221 and a plasmonic light collector such as plasmonic light sensor 16 having four corresponding arrays of plasmonic image pixels such as pixels 32. In the example of a four lens, four array device, one array of plasmonic image pixels may be configured to capture red light, one array of plasmonic image pixels may be configured to capture blue light, one array of plasmonic image pixels may be configured to capture green light and one array of plasmonic image pixels may be configured to capture infrared light. The example of a device having four lenses and four arrays is merely illustrative. Device 10 may have four lenses, may have more than four lenses, or may have less than four lenses. Device 10 may have four arrays of plasmonic image pixels such as array 30 of plasmonic image pixels 32, may have more than four arrays of plasmonic image pixels, or may have less than four arrays of plasmonic image pixels.

Plasmonic image pixels 32 may be configured such that plasmons (i.e., evanescent electron density waves) generated by incoming photons interact with the incoming photons and affect the path of travel of the incoming photons. Plasmonic image pixels 32 may include a support structure such as support structure 42. Support structure 32 (sometimes referred to as lens support structure 42) may be attached to one or more wires such as conducting wire 38 (sometimes referred to herein simply as wire 38). Plasmonic image pixels 32 may include microlenses such as microlenses 34 formed on lens support structure 42. Lens support structure 42 may be a substrate (e.g., silicon) or other support structure. Lens support structure 42 may be a single monolithic support structure for supporting multiple microlenses such as microlenses 34 or may be formed from individual lens support structures corresponding to each individual microlens 34. Lens support structure may be coated with a conducting material (e.g., gold, indium-tin-oxide (ITO) or other conducting material.

Microlenses 34 of plasmonic image pixels 32 may be formed from lithography of a dielectric substrate (e.g., silicon) used to form lens support structure 42, may be formed by deposition (e.g., screen printing) and curing (e.g., using u-v light) of a polymer material onto support structure 42 or by other methods.

Plasmonic image pixels 32 may include one or more wires such as wire 38 connected between lens support structure 42 and a light sensor such as detector circuitry 40 associated with each microlens 34. Wire 38 may be used to electrically couple detector circuitry 40 to conductive portions of lens support structure 42. Wire 38 may be formed from a single, cylindrical piece of conducting material (e.g., copper, gold, or other suitable conducting material), may be formed from multiple cylindrical strands of conducting material braided to form a braided wire, may be formed from a lattice of conducting structures (e.g., meta-material), or may be formed from other materials or configurations. Wire 38 may be used to guide light from microlenses 34 to detector circuitry 40. Wires 30 may use plasmons on the surface of wire 38 that couple to incoming light from microlenses 34 to alter the path of the incoming light such that the light is guided through plasmonic light sensor 16 to detector circuitry 40. Plasmons (i.e., oscillations of electrons near the surface of wire 38) may propagate along wire 38 and directly influence components of detector circuitry 40.

Detector circuitry 40 may include one or more photosensitive elements such as a p-n junction (i.e., an interface between a p-type semiconductor and an n-type semiconductor) for converting captured light into electrical charge. Detector circuitry 40 may include components such as reset transistors, charge storage nodes (also referred to as floating diffusion FD nodes), transfer transistors (transfer gates), or other components. Signals associated with the charge converted by a photodiode or current generated by detector circuitry 40 (sometimes referred to herein as image data) may be conveyed to processing circuitry 26 of electronic device 10 (see FIG. 1) through components such as row select transistors, source-follower transistors, or other components associated with detector circuitry 40. Some components of detector circuitry 40 (e.g., row select transistors, charge storage regions, reset transistors, etc.) may be shared among multiple plasmonic image pixels. Image data that has been captured by imaging module 20 may be processed and stored using processing circuitry 26. Processed image data may, if desired, be provided to external equipment (e.g., a computer or other device) using wired and/or wireless communications paths coupled to processing circuitry 26.

Plasmonic image pixels 32 may be configured to capture a light of a single color (e.g., red light, blue light, green light, infrared light, x-ray wavelength light, ultra-violet light, etc.) while rejecting light of another color, may be configured to capture a combination of individual colors, or may be configured to capture light having a wide continuous range of colors of light (e.g., light having wavelengths between 200 and 1000 nanometers).

Plasmonic light sensor 16 may have plasmonic image pixels 32 that all capture the same color of light or may have plasmonic image pixels that capture different colors of light (e.g., some pixels may be configured to capture blue light, some pixels may be configured to capture green light, some pixels may be configured to capture red light, some pixels may be configured to capture infrared light, etc.). Plasmonic light sensor 16 may include plasmonic image pixels 32 arranged to form an array of plasmonic image pixels having a Bayer color pattern (i.e., pixels configured to capture blue light, green light, and red light may be arranged in an alternating Bayer color pattern). Plasmonic light sensor 16 may include plasmonic image pixels 32 configured to capture multiple colors of light and arranged to form an imaging spectrometer (i.e., pixels that capture different colors of light may be arranged in rows of plasmonic image pixels such that an object scanned across the rows may be imaged in multiple different colors, as in an optofluidic microscope). Plasmonic image pixels 32 may be configured to produce a large current in response to a small amount of light (e.g., by biasing a p-n junction associated with detector circuitry 40 such that a small additional charge created by a small amount of light results in a breakdown of the semiconductor material that forms the p-n junction causing an avalanche of detectable charge).

Figure 4:
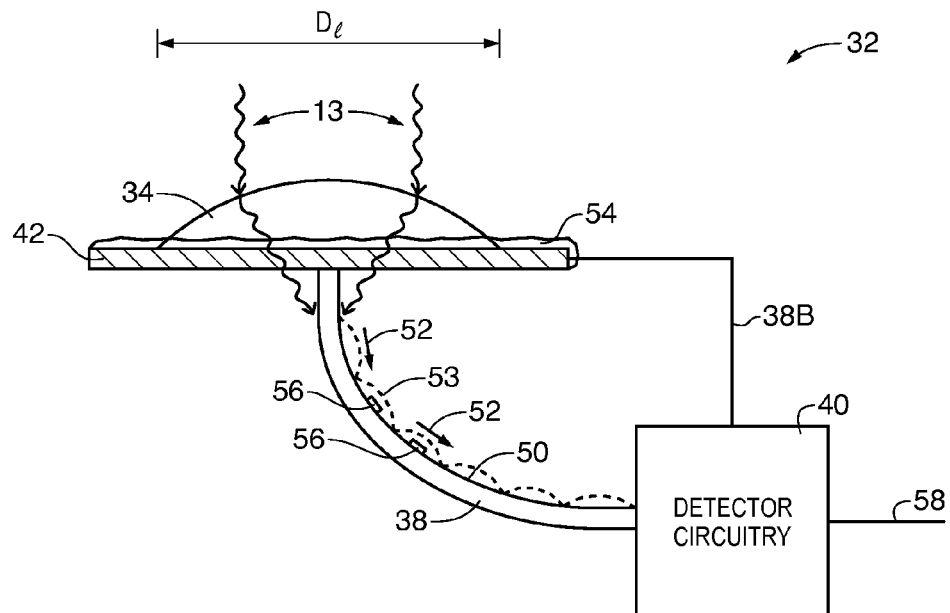
FIG. 4 is a cross-sectional side view of a plasmonic image pixel in which a light sensor having a curved wire in accordance with an embodiment of the present invention.

As shown in FIG. 4, wire 38 of plasmonic image pixel 32 may be curved to direct incident light such as light 13 (or plasmons generated on wire 38 by incident light 13) along curved paths within plasmonic light sensor 16. Plasmonic image pixels 32 may be configured such that surface plasmons are produced on surface 50 of wire 38. Plasmons may be considered to be oscillations in the electron density at surface 50 of wire 38 that travel along surface 50 of wire 38 as indicated by arrows 52 in an evanescent wave such as evanescent wave 53. Evanescent wave 53 may be generated by incoming light 13 that has been focused onto wire 38 by microlens 34. Plasmonic image pixel 32 may include one or more wire 38 for guiding incoming light and additional wires such as wire 38B for electrically coupling detector circuitry such as detector circuitry 40 to support structure 42. As described in connection with FIG. 3, support structure 42 may be conductively coupled to plasmonic wire 38 and communications wire 38B using a conductive coating such as conductive coating 54 on lens support structure 42. Conducting coating 54 may be formed from a conducting material such as gold, indium-tin-oxide (ITO) or other conducting material. Microlenses 34 of plasmonic image pixels 32 may be formed from lithography of a dielectric substrate (e.g., silicon) used to form lens support structure 42, may be formed by deposition (e.g., screen printing) and curing (e.g., using u-v light) of a polymer material onto support structure 42 or by other methods.

Wire 38 may be provided with one or more surface features 56. Surface features 56 or other properties of wire 38 such as length, width, and exterior shape may be configured to enhance production of evanescent waves 53 by some colors of light while suppressing production of evanescent waves by other colors of light. By tuning surface features 56 or other properties of wire 38, plasmonic image pixel may be configured to be a color image pixel sensitive to light of a chosen color (e.g., a red image pixel sensitive to red light, a blue image pixels sensitive to blue light, a green image pixel sensitive to green light, an infrared image pixel sensitive to infrared light, or any other color pixel sensitive to any other color of light). By combining multiple plasmonic image pixels 32 configured to be sensitive to light of different colors, plasmonic light sensor 16 (see FIG. 1) may be configured to form a color image pixel array such as (for example) a Bayer color image pixel array (i.e., an array of image pixels arrange in a Bayer color pattern).

Plasmonic image pixels 32 may be configured to produce a current in response to a small amount of light (e.g., by biasing a p-n junction associated with detector circuitry 40 such that a plasmons created by a small amount of light results in a breakdown (sometimes called an avalanche breakdown) of the semiconductor material that forms the p-n junction causing an avalanche of detectable charge). Detection of light using a biased p-n junction for avalanche detection may allow further detection of the time of arrival of individual pulses of light (i.e., in laser range finding applications) using detector circuitry 40 to record the leading edge of the avalanche of electrons produced following the breakdown of the semiconductor material. Detected signals (e.g., light intensity, light arrival times, etc.) detected by detector circuitry 40 may be conveyed to processing circuitry 26 (see FIG. 1) along path 58.

Because light 13 or plasmons generated by light 13 may be guided along wire 38 using plasmonic effects, plasmonic image pixel 32 may have dimensions smaller than the wavelength of light 13. As an example, plasmonic image pixel 32 may have a maximum lateral dimension Dp (indicated in FIG. 4) as small as 10 nanometers (e.g., 900 nanometers, less than 900 nanometers, 500 nanometers, less than 500 nanometers, more than 500 nanometers but less than 900 nanometers, 200 nanometers, less than 200 nanometers, more than 200 nanometers but less than 500 nanometers, 10 nanometers, more than 10 nanometers but less than 200 nanometers, etc.). The example of FIG. 4 in which wire 38 of plasmonic image pixel 32 is curved is merely illustrative.

Figure 5:
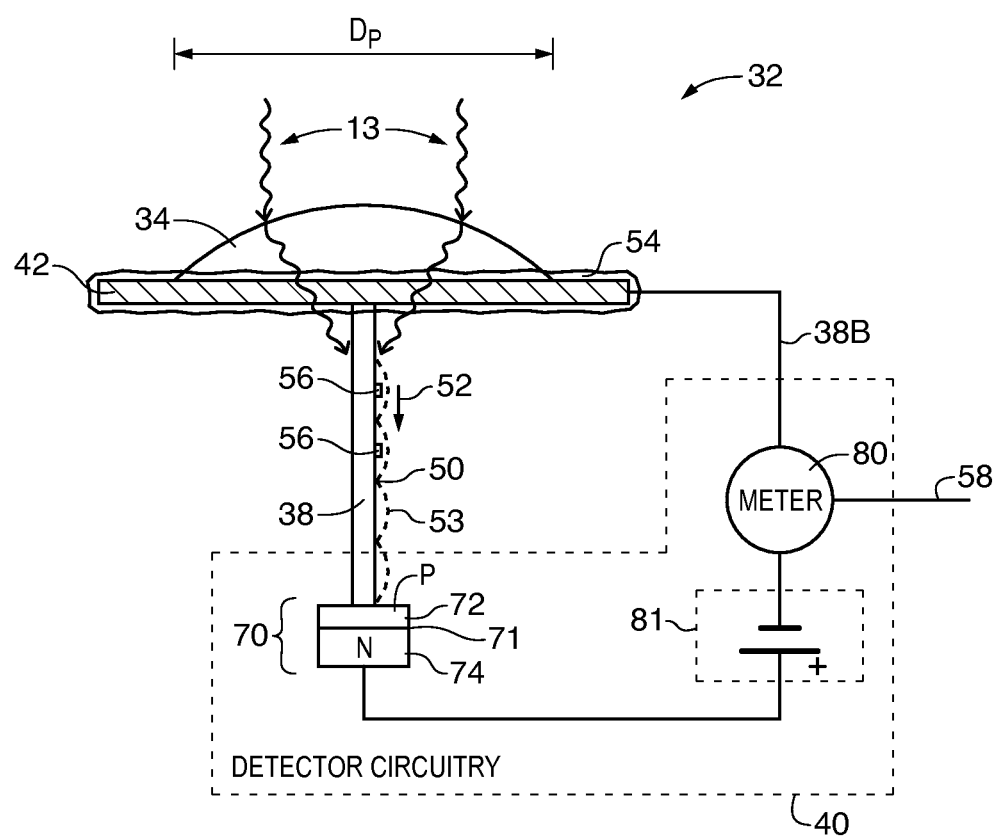
FIG. 5 is a cross-sectional side view of an illustrative plasmonic image pixel in accordance with an embodiment of the present invention.

As shown in FIG. 5, wire 38 of plasmonic image pixels such as plasmonic image pixel 32 may be substantially straight and evanescent wave 53 that has been generated by light such as light 13, may travel along straight paths within plasmonic light sensor 16 to detector circuitry 40. Microlens 34 may be configured to focus incoming light 13 toward conducting wire 38. Evanescent wave 53 may be generated by incoming light 13 that has been focused onto wire 38 by microlens 34. As indicated by arrows 52, evanescent wave 53 may propagate along surface 50 of wire 38. Plasmonic image pixel 32 may include one or more wires such as wire 38 and additional wires such as wire 38B for electrically coupling detector circuitry such as detector circuitry 40 to support structure 42. As described in connection with FIGS. 3 and 4, lens support structure 42 may be conductively coupled to plasmonic wire 38 and communications wire 38B using a conductive coating such as conductive coating 54 on lens support structure 42. Conductive coating 54 may be formed from a conducting material such as gold, indium-tin-oxide (ITO) or other conducting material. Conductive coating 54 may cover a portion of lens support structure 42 or may cover all surfaces of lens support structure 42. Microlenses 34 of plasmonic image pixels 32 may be formed from lithography of a dielectric substrate (e.g., silicon) used to form lens support structure 42, may be formed by deposition (e.g., screen printing) and curing (e.g., using u-v light) of a polymer material onto support structure 42 or by other methods.

Wire 38 may be provided with one or more surface features 56. Surface features 56 or other properties of wire 38 such as length, width, and exterior shape may be configured to enhance production of evanescent waves 53 by some colors of light while suppressing production of evanescent waves by other colors of light. By tuning surface features 56 or other properties of wire 38, plasmonic image pixel may be configured to be a color image pixel sensitive to light of a chosen color (e.g., a red image pixel sensitive to red light, a blue image pixels sensitive to blue light, a green image pixel sensitive to green light, an infrared image pixel sensitive to infrared light, or any other color pixel sensitive to any other color of light). By combining multiple plasmonic image pixels 32 configured to be sensitive to light of different colors, plasmonic light sensor 16 (see FIG. 1) may be configured to form a color image pixel array such as (for example) a Bayer color image pixel array (i.e., an array of image pixels arrange in a Bayer color pattern).

Because light 13 or plasmons generated on surface 50 of wire 38 by light 13 may be guided along wire 38 using plasmonic effects (i.e., evanescent waves 53), plasmonic image pixel 32 may have dimensions smaller than the wavelength of light 13. As an example, plasmonic image pixel 32 may have a maximum lateral dimension Dp (indicated in FIG. 5) as small as 10 nanometers (e.g., 900 nanometers, less than 900 nanometers, 500 nanometers, less than 500 nanometers, more than 500 nanometers but less than 900 nanometers, 200 nanometers, less than 200 nanometers, more than 200 nanometers but less than 500 nanometers, 10 nanometers, more than 10 nanometers but less than 200 nanometers, etc.).

Plasmonic image pixels 32 may be configured to produce an output current in response to a small amount of light (e.g., by biasing a p-n junction associated with detector circuitry 40 such that any charge transferred to semiconducting layers 70 from wire 38 results in a breakdown of the semiconductor material that forms the p-n junction causing an avalanche of detectable charge through the p-n junction). Detection of light using this biased photodiode, avalanche detection may facilitate detection of the time of arrival of an individual pulse of light (e.g., a pulse of light emitted by a laser and reflected by an object and into plasmonic light sensor 16) using detector circuitry 40 to record the leading edge of the avalanche of electrons produced following the breakdown of the semiconductor material. Detected signals (e.g., light intensity, light arrival times, etc.) detected by detector circuitry 40 may be conveyed to processing circuitry 26 (see FIG. 1) along path 58.

As shown in FIG. 5, detector circuitry 40 of plasmonic image pixel 32 may include one or more semiconducting layers such as semiconducting layers 70. Semiconducting layers 70 may include at least one p-type semiconducting layer such as p-type semiconducting layer 72 and at least one n-type semiconducting layer such as n-type semiconducting layer 74. P-type layer 72 and n-type layer 74 may form p-n junction 71 such that a portion of p-n junction 71 may be used to form a photodiode (light sensor) for detecting light captured by plasmonic image pixel 32. Wire 38 may be coupled to semiconductor layers 70. A voltage may be applied across p-n junction 71 using biasing component 81 so that, during operation of plasmonic image pixel 32, p-n junction 71 may be kept near the breakdown voltage of the p-n junction (i.e., the voltage at which the semiconducting material breaks down and current is allowed to flow through the semiconducting material). By coupling wire 38 to semiconducting layers 70, evanescent wave 53 may induce charge to flow into p-n junction 71. Charge flow into p-n junction 71 may result in a breakdown (sometimes called an avalanche breakdown) of the semiconducting material allowing current to flow freely through p-n junction 71. P-n junction 71 may be coupled to wire 38B through circuitry such as metering circuitry 80. Circuitry 80 (also called metering circuitry) may be configured to measure current flowing through wire 38, p-n junction 71, conducting layer 54 and wire 38B. Current measured by metering circuitry 80 may be transferred to processing circuitry 26 (see FIG. 1) along path 58. Processing circuitry 26 may also record the time of arrival of the leading edge of the additional current flow induced by the breakdown of semiconducting materials 70.

Various embodiments have been described illustrating electronic devices with plasmonic light sensors. Plasmonic light sensors may include arrays of plasmonic image pixels that exploit an interaction between incoming light and evanescent waves of electron density oscillations on conducting surfaces in the plasmonic image pixel to detect the incoming light. Plasmonic effect may allow plasmonic image pixels to detect light having wavelengths significantly larger than the size of the plasmonic image pixel. Plasmonic image pixels may include microlenses for focusing light onto wires in the plasmonic image pixel. Evanescent waves of electron density may be generated on the surface of the wire that propagate along the wire and couple to the incoming light. Detector circuitry may be coupled to the wire on which the evanescent surface waves are generated by the incoming light and detect the light through detection of the evanescent density wave. Alternatively, evanescent waves of electron density that are generated by incoming light and propagate along on the surface of the wire may couple to the incoming light to guide the light along the surface of the wire and into the detector circuitry. Detector circuitry may include a photodiode for detecting light that has been guided onto the photodiode by the evanescent wave. The photodiode may include a p-n junction that may be voltage biased using a biasing component in the detector circuitry so that a small amount of light (e.g., a single photon) results in an avalanche of charge produced in the detector circuitry in response to the evanescent wave. Photodiodes biased to near the breakdown voltage of semiconducting material from which the photodiodes are formed may allow detection of the arrival time of individual photons into the plasmonic image pixel. Detector circuitry may include one or more metering circuits for metering current produced during a breakdown of semiconducting materials in the detector circuitry due to the generated evanescent waves.

The foregoing is merely illustrative of the principles of this invention which can be practiced in other embodiments.

What is claimed is:

1. A plasmonic image pixel, comprising:
   a support structure;
   a conducting wire attached to the support structure;
   detector circuitry coupled to the conducting wire, wherein the conducting wire is configured to generate plasmons that propagate along a surface of the conducting wire in response to light, and wherein the detector circuitry is configured to detect the plasmons;
   a microlens formed on the support structure that focuses the light onto the conducting wire; and
   a conductive coating on the support structure, wherein the conducting wire is electrically coupled to the support structure using the conductive coating, and wherein the conductive coating comprises indium tin oxide.

2. The plasmonic image pixel defined in claim 1 further comprising an additional wire coupled between the detector circuitry and the conductive coating on the support structure.

3. A plasmonic image pixel, comprising:
   a support structure;
   a conducting wire attached to the support structure; and
   detector circuitry coupled to the conducting wire, wherein the conducting wire is configured to generate plasmons that propagate along a surface of the conducting wire in response to light, and wherein the detector circuitry is configured to detect the plasmons;
   a conductive coating on the support structure, wherein the conducting wire is electrically coupled to the support structure using the conductive coating;
   an additional wire coupled between the detector circuitry and the conductive coating on the support structure wherein the detector circuitry comprises:
   a p-type semiconductor layer;
   an n-type semiconductor layer adjacent to the p-type semiconductor layer, wherein the n-type semiconductor layer and the p-type semiconductor layer form a p-n junction; and a biasing element that applies a bias voltage to the p-n junction so that the plasmons that propagate along the surface of the conducting wire cause an avalanche breakdown of the p-n junction that allows a current to flow through the p-n junction, the additional wire, the conductive coating on the support structure, and the conducting wire.

4. The plasmonic image pixel defined in claim 3, the detector circuitry further comprising circuitry coupled between the p-n junction and the support structure for measuring the current.

5. The plasmonic image pixel defined in claim 4 wherein the conducting wire comprises surface features on the surface of the conducting wire that prevent plasmons from being generated on the surface by light of a first color and that permit plasmons to be generated on the surface by light of another color that is different from the first color.

\* \* \* \* \*